US009533838B2

(12) United States Patent
Dellea et al.

(10) Patent No.: US 9,533,838 B2
(45) Date of Patent: Jan. 3, 2017

(54) METHOD FOR TRANSFERRING OBJECTS ONTO A SUBSTRATE BY MEANS OF A COMPACT FILM OF PARTICLES (71) Applicant: Commissariat a l'energie atomique et aux ene alt, Paris (FR)

(72) Inventors: Olivier Dellea, La Talaudiere (FR); Philippe Coronel, Barraux (FR); Pascal Fugier, Bernin (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 361 days.

(21) Appl. No.: 14/369,752

(22) PCT Filed: Dec. 28, 2012

(86) PCT No.: PCT/EP2012/077052
§ 371 (c)(1),
(2) Date: Jun. 30, 2014

(87) PCT Pub. No.: WO2013/102608
PCT Pub. Date: Jul. 11, 2013

(65) Prior Publication Data
US 2014/0356528 A1 Dec. 4, 2014

(30) Foreign Application Priority Data
Jan. 2, 2012 (FR) ...................... 12 50028

(51) Int. Cl.
*B29C 65/70* (2006.01)
*B65G 53/00* (2006.01)
(Continued)

(52) U.S. Cl.
CPC ............. *B65G 53/00* (2013.01); *B05D 3/0254* (2013.01); *H01L 21/67721* (2013.01);
(Continued)

(58) Field of Classification Search
CPC ........................................................ B05D 1/20
See application file for complete search history.

(56) References Cited

U.S. PATENT DOCUMENTS 7,804,134 B2      9/2010   Coronel et al.
2011/0135834 A1   6/2011   Schneider et al.
(Continued)

FOREIGN PATENT DOCUMENTS

CA    2 695 449    2/2008
EP    2 355 145    8/2011

OTHER PUBLICATIONS

U.S. Appl. No. 14/398,340, filed Oct. 31, 2014, Savelli, et al.
(Continued)

*Primary Examiner* — Xiao Zhao
(74) *Attorney, Agent, or Firm* — Oblon, McClelland, Maier & Neustadt, L.L.P.

(57) ABSTRACT

A method of transferring objects onto a substrate, or a moving substrate, the objects to be transferred being placed in a transfer area including an inlet and an outlet spaced apart from one another by two lateral edges opposite one another, and holding a carrier liquid forming a conveyor, the objects being held by a compact film of particles floating on the carrier liquid of the transfer area, in which the objects are moved with the particle film to be transferred onto the substrate when they reach the outlet.

12 Claims, 7 Drawing Sheets (51) Int. Cl.
*H01L 21/677* (2006.01)
*B05D 3/02* (2006.01)

(52) U.S. Cl.
CPC .... *H01L 21/67784* (2013.01); *B05D 2252/02* (2013.01); *B05D 2401/32* (2013.01)

(56) References Cited

U.S. PATENT DOCUMENTS

2013/0052552 A1   2/2013  Phan et al.
2013/0330471 A1  12/2013  Dellea et al.
2014/0147583 A1   5/2014  Dellea et al.
2014/0158334 A1   6/2014  Dellea et al.

OTHER PUBLICATIONS

U.S. Appl. No. 14/423,957, filed Feb. 25, 2015, Dellea, et al.
International Search Report Issued Jan. 30, 2013 in PCT/EP12/077052 Filed Dec. 28, 2012.
U.S. Appl. No. 14/232,092, filed Jan. 10, 2014, Savelli, et al.
U.S. Appl. No. 14/375,858, filed Jul. 31, 2014, Dellea, et al.
U.S. Appl. No. 14/375,994, filed Jul. 31, 2014, Dellea, et al.
U.S. Appl. No. 14/375,532, filed Jul. 30, 2014, Dellea, et al.

METHOD FOR TRANSFERRING OBJECTS ONTO A SUBSTRATE BY MEANS OF A COMPACT FILM OF PARTICLES

TECHNICAL FIELD

The invention relates to the field of transferring objects onto a substrate, preferably moving, in order to produce various devices.

It relates in particular to the production of hybrid devices, such as, for example, sensors. As an indication, a hybrid device associates, by definition, on a single substrate, objects having a variety of functions, for example electronic, optical, electro-optical, piezoelectric, thermoelectric, mechanical, and so on.

The objects to be deposited/transferred are, for example:
- active electronic components, such as transistors, microprocessors, integrated circuits, etc.;
- passive electronic components, such as resistors, capacitors, diodes, photodiodes, coils, conductive tracks, weld preforms, etc.;
- optical components, such as lenses, microlenses, diffraction gratings, filters, etc.;
- cells, microcells, microbatteries, photodetectors, solar cells, RFID systems, etc.;
- active or passive nano or micrometric particles or aggregates, for example of the oxide, polymer, metal, semiconductor, Janus, nanotube type, etc.

More specifically, the invention relates to the transfer of objects of which the dimensions range:
- for components: from the microscopic scale (some tens of microns) to the macroscopic scale (more than around ten centimeters); and
- for particles and aggregates: from the nanometer to some hundreds of microns.

PRIOR ART

In the industrial domain, the problem of transfer/deposition of objects onto a substrate is generally solved by the use of the technique called "pick and place", which consists in taking the objects one by one with a suitable gripping tool, and placing them precisely on the substrate. This technique can, however, be improved upon, in particular in the sense that it is often difficult or even impossible to move an object once it has been deposited on the substrate. In the event of a handling error, the object may then remain adhered to the substrate in the wrong position.

DESCRIPTION OF THE INVENTION

The invention is therefore intended to overcome, at least partially, the disadvantages mentioned above, concerning the embodiments of the prior art.

To this end, the invention relates to a method for transferring objects onto a substrate, preferably moving, by means of a transfer area comprising an inlet and an outlet spaced apart from one another by two lateral edges opposite one another, and holding a carrier liquid forming a conveyor, said objects being held by a compact film of particles floating on the carrier liquid of this transfer area, in which said objects are moved with said particle film so as to be transferred onto the substrate when they reach the outlet.

The invention is thus notable in that it is based on the use of a compact particle film for holding the objects in position on the carrier liquid, then for conveying these same objects to the substrate. The transfer of the objects onto the substrate can consequently be performed with precision, in a simple, reliable and repetitive manner. Moreover, as the objects are not deposited directly onto the substrate, it is easy to adjust their position in the transfer area, before they are deposited on this same substrate.

The compact particle film is therefore like a platform enabling homogeneous or heterogeneous nanoscopic, microscopic or macroscopic objects to be received. This platform can itself be comprised of a homogeneous or heterogeneous nanometric or microscopic particles, preferably having compositions different from those of the objects to be transferred. As will be described in detail below, the objects to be transferred can be integrated with this platform, or simply arranged on it.

In fact, according to a first possibility, at least one of the objects to be transferred is placed in the transfer area, floating on the carrier liquid forming a conveyor, so as to be surrounded by the compact particle film. In this case, the objects are held in position by the particles that surround them at their periphery. The objects thus have a lower surface directly in contact with the carrier liquid.

According to a second possibility, at least one of the objects to be transferred is placed in the area for transfer onto the compact particle film previously formed, so as to create, in the carrier liquid, a compression of the particles supporting it.

In this second solution, the compressed particles located under each object then define a level change with respect to the surrounding film particles. It is then these same surrounding particles that surround the periphery of each object, thus enabling them to be held in position and transported in a manner similar to that of the first solution.

Of course, some objects can be placed in the particle film according to the first solution and others according to the second solution, without going beyond the scope of the invention.

Moreover, as mentioned above, the compact particle film can be formed by heterogeneous particles. These particles can also be functionalized at their surface so that a physical bond between particles forms, for example of the polymer type, in order to reinforce the cohesion and therefore the bearing capacity of the compact film.

Preferably, the ratio between the large dimension of the particles of the compact film and that of the objects to be transferred is between $10^4$ and $10^8$. As an example, the particles forming the compact film can have a large dimension on the order of 1 nm to 500 µm, while the objects conveyed by this film can have a large dimension reaching up to around 30 cm.

Preferably, the particles of the compact film are silica beads around 1 µm in diameter. It is nevertheless noted that the film may be heterogeneous, and specifically comprise beads of different sizes.

Preferably, each object to be transferred has a large dimension greater than 0.2 cm, and preferably smaller than 30 cm. This latter value can be adjusted according to the width of the transfer area. Indeed, the large dimension of each object can reach a value close to the aforementioned width. Micrometric or nanometric objects can also be deposited/transferred, without going beyond the scope of the invention.

Preferably, each object to be transferred has at least one hydrophobic portion. This is intended to ensure the flotation of the object, by placing this portion in contact with the carrier liquid. This contact face for contact with the liquid can be entirely hydrophobic or consist of an arrangement of hydrophilic and hydrophobic areas, useful for the end device.

The object to be transferred can have any shape, not necessarily planar, and optionally have one or more radii of curvature, for example less than 5 cm, or integrate pins useful for connections. Similarly, the film particles may have various shapes.

As indicative examples, each object to be transferred can be an element from the group of silicon chips, microbatteries, organic electronic components, metal elements, photovoltaic cells, cells and microcells.

The production of complex devices is also covered, such as, for example, sensors comprising detection elements (particles, for example), one or more energy collection systems (PV cell, piezoelectric film, fuel cell), an energy storage system (microbattery), an information management system (silicon chip), a communication system (RFID chip), electrical connection elements (conductive tracks) electronic components (resistors, capacitors), and weld elements (preforms). The objects necessary for obtaining these devices are then consequently arranged on the liquid conveyor, and superimposed, as necessary.

It is also noted that the compact particle film, the concept of which is, for example, disclosed in the document Sachin Kinge, "*Self-Assembling Nanoparticles at Surfaces and Interfaces*", *Chem Phys Chem* 2008, 9, 20-42, can be obtained at the surface of the carrier liquid by any technique known to a person skilled in the art, for example by compression and/or dipole-dipole interaction, and/or by magnetic field, and so on.

The dipole-dipole interaction technique is applied to faceted particles, for example tetrahedric, cubic or octahedric particles. With these shapes, the dipole-dipole interactions play an important role in the organization of the particles. Dipole moments are generated inside these particles, due to differences in polarity between the facets.

The technique of organization by magnetic field is used with magnetic nanoparticles capable of being ordered using an intense magnetic field, generating strong interactions between the particles.

The compression technique is in particular known from the document Lucio Isa et al., "*Particle Lithography from Colloidal Self-Assembly at Liquid_Liquid Interfaces*", *acsnano*, VOL. 4■NO. 10■5665-5670■2010, the document Markus Retsch, "*Fabrication of Large-Area, Transferable Colloidal Monolayers Utilizing Self-Assembly at the Air/Water Interface*", *Macromol. Chem. Phys.* 2009, 210, 230-241, or the document Maria Bardosova, "*The Langmuir-Blodgett Approach to Making Colloidal Photonic Crystals from Silica Spheres*", *Adv. Mater.* 2010, 22, 3104-3124.

This compression technique also comprises the inclined ramp solution described in the document CA 2 695 449. Thus, the method according to the invention preferably implements an inclined ramp for particle circulation, attached to said inlet of the transfer area, and on which said carrier liquid is also intended to circulate.

A portion of the energy necessary for ordering the particles under normal conditions is in this case then brought by the inclined ramp transporting the carrier liquid and the particles. Other solutions are nevertheless possible, such as the movement, by means of a pump, of the carrier liquid on a horizontal plane, the downstream portion of which forms the particle transfer area. Another solution consists in replacing the pump with a wind tunnel enabling an air flow to be applied to the surface of the carrier liquid, on which the particles and the objects to be transferred float. As mentioned above, other solutions can nevertheless be envisaged, without going beyond the scope of the invention, such as particle compression via a so-called "Langmuir-Blodgett" technique.

Finally, after the particles and objects have been transferred onto the substrate, the method preferably comprises a thermal annealing step to facilitate the deposition and adhesion of said particles and objects on the substrate.

Other advantages and features of the invention will appear in the non-limiting detailed description below.

BRIEF DESCRIPTION OF THE DRAWINGS

This description is provided in view of the appended drawings, wherein.

DETAILED DESCRIPTION OF PREFERRED EMBODIMENTS

Figure 1:
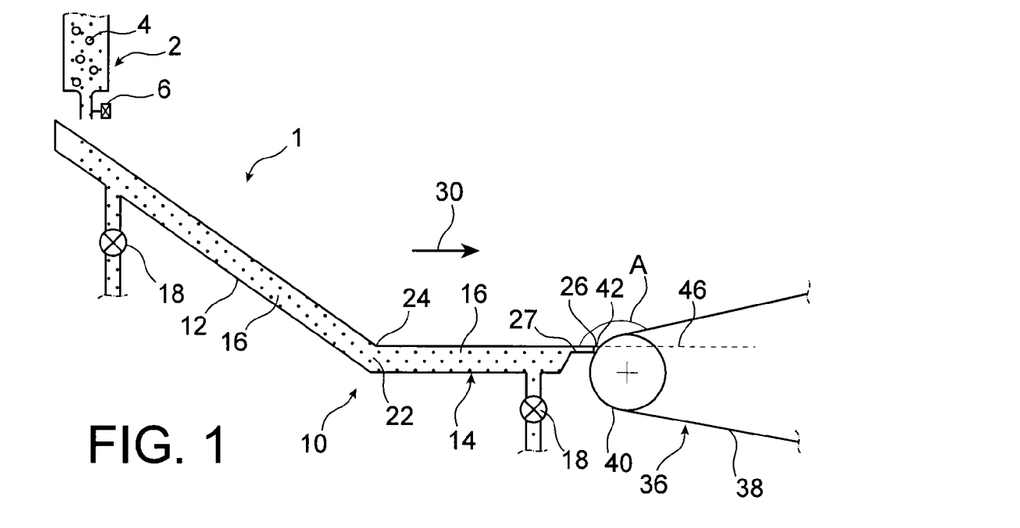
FIG. 1 shows a transfer system according to a preferred embodiment of the present invention, in a schematic cross-section along line I-I of FIG. 2.
Figure 2:
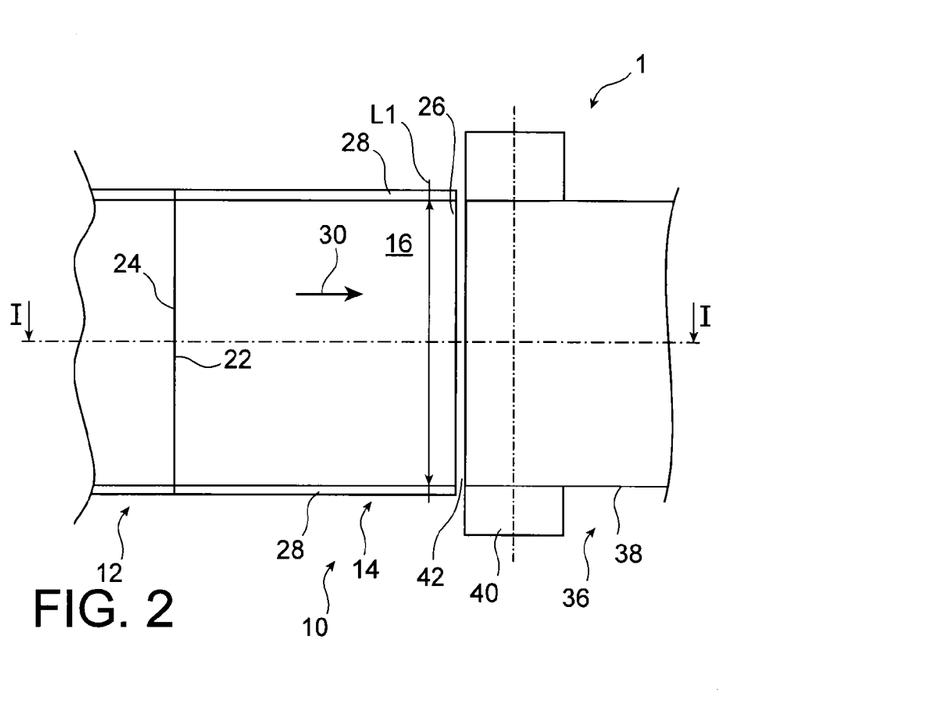
FIG. 2 shows a schematic top view of the transfer system shown in FIG. 1.

In reference first to FIGS. 1 and 2, the figures show a system 1 for transferring objects onto a substrate, which preferably is moving. This transfer, which is similar to a deposition, is performed by means of a compact particle film.

The system 1 comprises a device 2 for dispensing particles 4, the size of which can be between several nanometers and several hundred micrometers. The particles, preferably spherical, can, for example, be silica particles. Other particles of interest can be made of metal or metal oxide, such as platinum, $TiO_2$, polymer such as polystyrene or PMMA, carbon, etc.

More specifically, in the preferred embodiment, the particles are silica spheres around 1 µm in diameter, stored in solution in the dispensing device 2. The proportion of the medium is around 7 g of particles for 200 ml of solution, in this case butanol. Naturally, for the sake of clarity, the particles shown in the figures have a diameter greater than their real diameter.

The dispensing device 2 has a controllable injection nozzle 6 around 500 µm in diameter.

The system also has a liquid conveyor 10, comprising an inclined ramp 12 for particle circulation, and a transfer area 14 that is substantially horizontal or even having a slight inclination so as to promote the emptying of the system, as the case may be. The top end of the inclined ramp is intended to receive the injected particles from the dispensing device 2. This ramp is straight, inclined at an angle of between 5 and 60°, preferably between 10 and 30°, enabling the particles to be carried toward the transfer area 14. In addition, a carrier liquid 16 circulates on this ramp 12, to the transfer area. This liquid 16 can also be re-circulated by means of one or two pumps 18, between the transfer area 14 and the top end of the ramp. In this case, it is preferably deionized water, on which the particles 4 can float. Nevertheless, it is possible to opt for a new liquid via an open circulation circuit. It is also possible to use an association of a plurality of non-miscible liquids.

The bottom end of this same ramp is connected to an inlet of the particle transfer area 14. This inlet 22 is located at a bend line 24 showing the junction between the surface of the carrier liquid present on the inclined plane of the ramp 12, and the surface of the carrier liquid present on the horizontal portion of the transfer area 14.

The particle inlet 22 is spaced apart from a particle outlet 26 by means of two lateral edges 28 holding the carrier liquid 16 in the area 14. These edges 28, opposite and at a distance from one another, extend parallel to a main direction of flow of the carrier liquid and the particles in the system, this direction being schematically represented by the arrow 30 in FIGS. 1 and 2. The area therefore has the shape of a corridor or a path that is open at its inlet and its outlet, although other shapes may be chosen without going beyond the scope of the invention.

The bottom of the downstream portion of the transfer area has a platform 27 slightly inclined, for example, at 5 to 10°, in the upstream direction with respect to the horizontal direction. It is the downstream end of this same platform 27, also called a "blade", that partially defines the particle outlet 26.

The system 1 is also equipped with a substrate conveyor 36 intended to move the substrate 38. This substrate can be rigid or flexible. In the latter case, it can be moved over a roller 40, the axis of which is parallel to the outlet 26 of the area 14, located near it. In fact, the substrate 38 is intended to move very close to the outlet 26, so that the particles reaching said outlet can easily be transferred onto said substrate, via a capillary bridge 42, also called a meniscus, which connects it to the carrier liquid 16. Alternatively, the substrate can be in direct contact with the transfer area, without going beyond the scope of the invention. The capillary bridge mentioned above is then no longer required.

In the example shown in the figures, the width of the substrate corresponds to the width of the area 14 and its outlet 26. The width L1 also corresponds to the maximum width of the particle film that can be deposited onto the substrate. This width can be on the order of 25 to 30 cm. The width of the substrate onto which the particles are to be deposited may, however, be smaller than the width L1.

The capillary bridge 42 is produced between the carrier liquid 16 located at the outlet 26 and a portion of the substrate 38 following the guide/drive roller 40.

Preferably, the exterior angle A, formed between the horizontal direction 46 and the portion of the substrate 38 onto which the particle film and the objects are to be deposited, is greater than 160°, and even more preferably close to 180°, for example on the order of 175°.

A method for transferring objects will now be described in reference to FIGS. 3 to 7.

Figure 3:
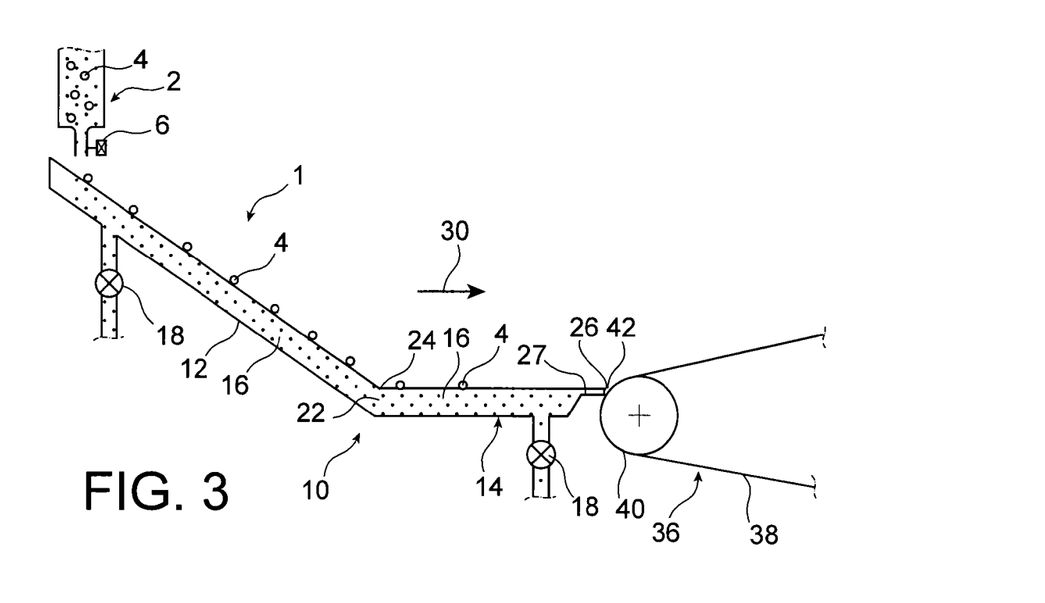
FIGS. 3 to 7 show different steps of a transfer method implemented by means of the system shown in the previous figures.

First, the injection nozzle 6 is activated so as to start the dispensing of particles 4 onto the ramp 12. This involves an initial step of filling the area for transfer 14, by the particles 4, with the carrier liquid 16 already at the level required in the area 14.

Figure 4:
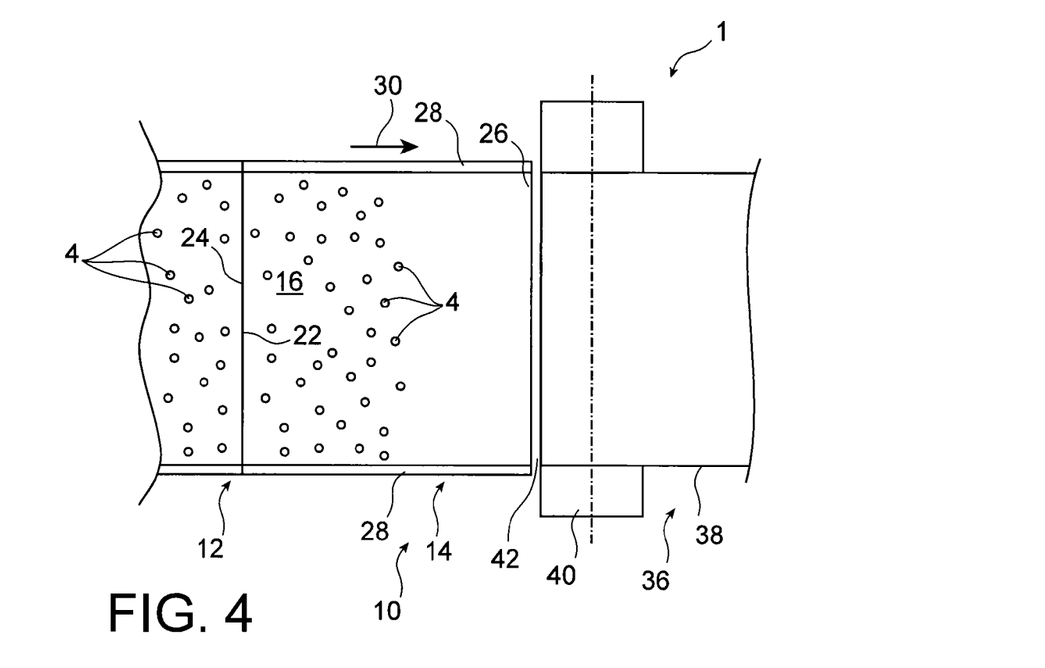

During this initiation phase, the particles dispensed by the device 2 circulate on the ramp 12, then penetrate the area 14 in which they are dispersed, as schematically shown in FIGS. 3 and 4.

As the particles 4 are injected onto the ramp 12 and penetrate the transfer area 14, they stop against the substrate 38, then the upstream leading edge of these particles tends to shift upstream, in the direction of the bend line 24. The injection of particles is continued even after this upstream leading edge has gone beyond line 24, so that it goes up the inclined ramp 12.

Figure 5:
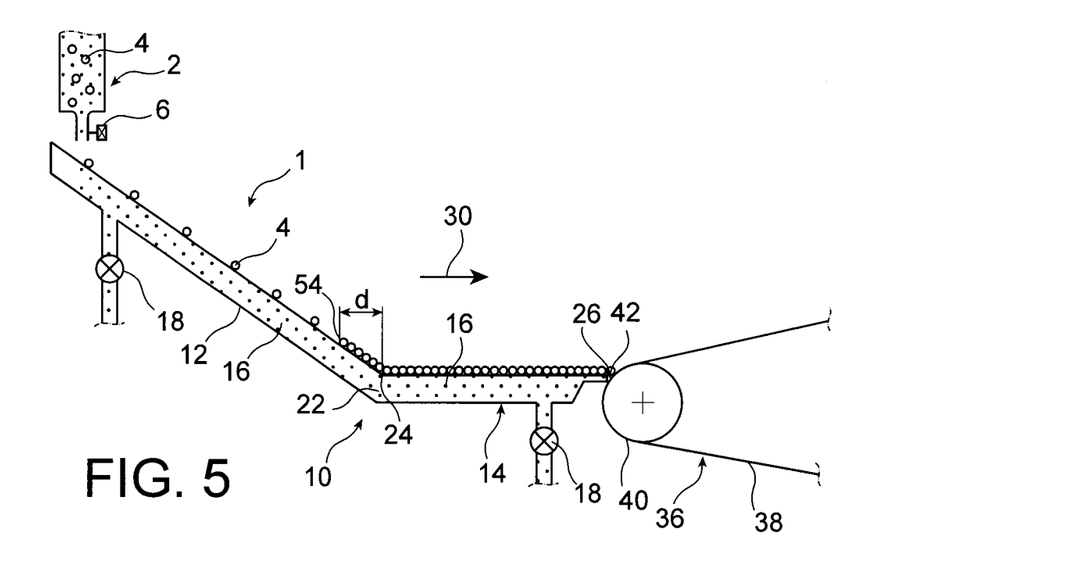

In fact, the upstream edge of particles 54 goes up the ramp 12 so as to be located at a given horizontal distance "d" from the bend line 24, as shown in FIG. 5. The distance "d" can be on the order of 30 mm.

At this time, the particles 4 are ordered in the transfer area and on the ramp 12, on which they are automatically ordered, without assistance, owing in particular to their kinetic energy utilized at the moment of impact on the leading edge 54. The ordering is such that the compact film obtained has a so-called "compact hexagonal" structure, in which each particle 4 is surrounded and contacted by six other particles 4 in contact with one another. It is then referred to indifferently as a compact particle film or an ordered particle film.

Once the ordered particles 4 cover all of the carrier liquid located in the transfer area 14, the objects 50 to be deposited/transferred can be positioned on top of the film, in predetermined locations. This positioning can be performed by means of conventional handling or gripping tools suited to the nature, shape and dimension of the objects, such as tongs. Other solutions are envisaged, as will be described below in reference to FIGS. 11a to 11e.

Figure 6:
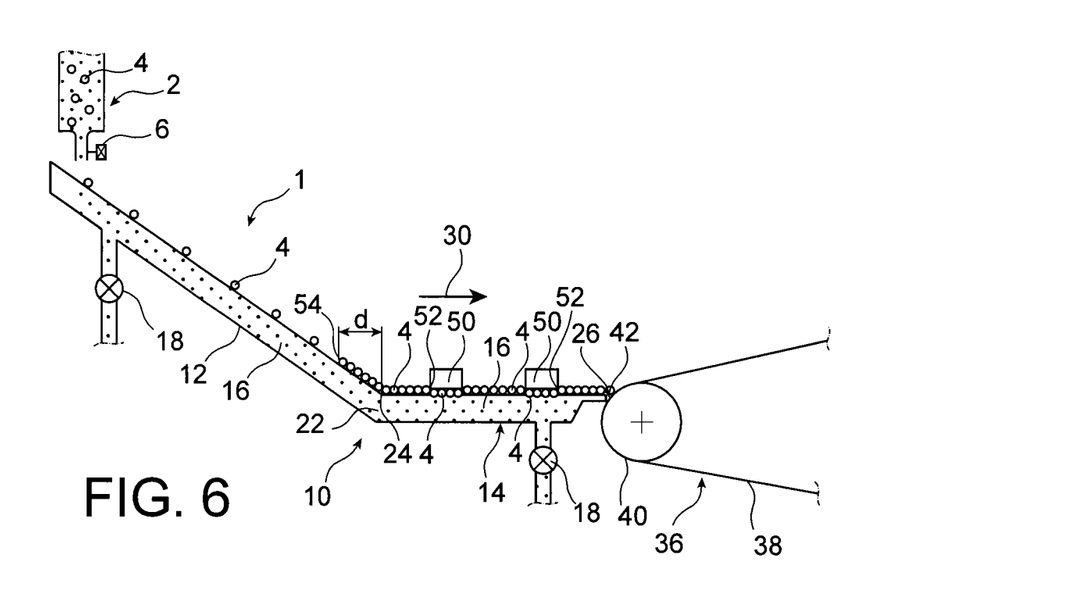

As shown in FIG. 6, the positioning of the objects 50 on the film results in the creation of a compression of particles 4 that support these same objects, in the carrier liquid 16 forming a conveyor. It is noted that the objects can be held at the surface of the liquid by the surface tension of this liquid, and the particle film modifying the surface tension of the liquid can then help, to some extent, to hold these objects.

More specifically, the compressed particles 4 located under each object 50 then define a level change 52 with respect to the other surrounding particles 4. It is these same surrounding particles that surround the periphery of each object 50, thus enabling them to be held in position with respect to one another, as well as with respect to the fixed structure of the transfer area.

Each level change 52 is preferably smaller than the diameter of the particles 4, so that the compressed particles 4 are also held and supported by the surrounding particles.

The positioning of the first objects, as well as the next ones, is preferably performed without stopping the flow of particles coming from the ramp 12, although this can be performed in a different manner without going beyond the scope of the invention.

Figure 7:
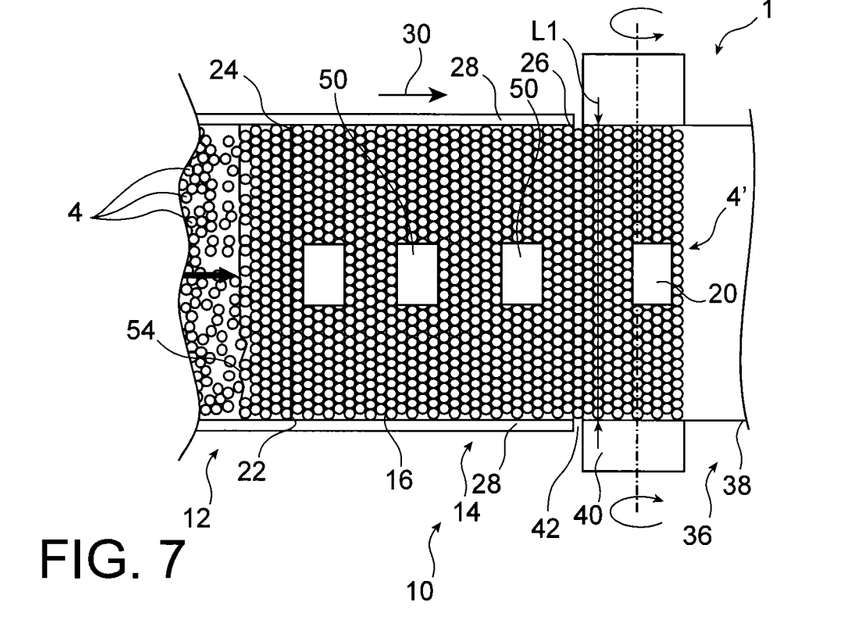

FIG. 7 shows the state of the system after the movement of the substrate 38 has been activated, initiated once the leading edge 54 has reached the required level shown in FIG. 5. The particle film and the objects carried, held and conveyed by the latter are then deposited onto the substrate 38 by taking the capillary bridge 42, as described in the document CA 2 695 449. As mentioned above, the width of this film 4' integrating the objects 50 corresponds to the width L1 of the outlet 26, although a smaller width can be chosen without going beyond the scope of the invention.

Even more preferably, the substrate is directly in contact with the particle outlet.

As the ordered particles 4 cover the entire surface of the carrier liquid 16 present in the transfer area, the ordering is thus preserved until the moment of deposition at the outlet 26 of the area 14. The preservation of this order ensures that a precise relative positioning between the objects 50, as well as a precise positioning with respect to the fixed lateral edges 28, is maintained until these objects 50 are deposited/transferred onto the substrate with the particles 4.

To facilitate the deposition and the adhesion of the particles 4 and objects 50 on the substrate, preferably made of polymer, a thermal anneal is performed after the transfer. This thermal anneal is, for example, performed at 80° C., using a low-temperature polyester-based matte roll film, for example sold under the name PERFEX-MATT™, having a thickness of 125 μm.

The advantage of such a film as a substrate is that one of its faces becomes adherent at a temperature on the order of 80° C., which makes it possible to facilitate the adhesion of the particles 4 and the objects 50 to it. As this temperature is relatively low with respect to the temperatures for producing the objects envisaged by the invention, such as silicon chips or photovoltaic cells, the attachment of these objects can be performed without any deterioration.

More specifically, at this temperature, the particles 4 are compressed in the softened film 38, and thus enable direct contact of the objects with the film, leading to their bonding.

Alternatively, the substrate 38 can be silicon, glass or a piezoelectric film.

During the transfer, the injection of particles and the speed of movement of the substrate are adjusted so that the leading edge of the particles remains in a substantially identical position. To do this, the flow of particles can be on the order of 0.1 ml/min to several ml/min, while the linear speed of the substrate 38, also called the pull speed, can be on the order of several mm/min to several hundred mm/min. Of course, the objects 50 are gradually deposited onto the ordered particle film 4, in the transfer area 14, before the assembly formed by these elements reaches the substrate 38 onto which it is then deposited/transferred.

The objects to be transferred can be of different types, depending on the desired uses. Preferably, each object 50 has a large dimension of greater than 0.2 cm and less than or equal to L1, i.e. close to 30 cm. The thickness is between around ten micrometers and several tens of millimeters.

Certain types of objects to be transferred, such as solar cells, microbatteries and organic components, have a simple square, rectangle or disk shape with a low thickness and a surface area on the order of 0.1 to 100 $cm^2$.

These components can comprise pins or pads on the face in contact with the liquid in order to produce the connection. Other types of objects, intended for example for element detection, energy generation or data transport, can have complex shapes, for example curved or spiral portions.

In addition, the ratio between the large dimension of the particles 4 and that of the objects 50 to be transferred is preferably between $10^4$ and $10^8$. In fact, the large dimension of the particles is, for example, on the order of 1 nm to 500 μm, while the objects conveyed 50 can have a large dimension reaching up to around 30 cm.

Preferably, the face of each object 50 in contact with the carrier liquid is hydrophobic, but it is also possible to provide an arrangement of hydrophilic and hydrophobic portions at this face. As mentioned above, the surface tension of the carrier liquid also plays an important role in the flotation of these objects.

The table below presents some preferred examples for these objects 50.

| Type | Dimensions | Field of application |
|---|---|---|
| Polyethylene terephthalate (PET) with structured gold layer at the surface | PET: 3 × 4 $cm^2$; thickness 250 μm; PET: 1.5 × 0.9 $cm^2$; thickness 250 μm, Gold: thickness 30 nm | Organic electronics |
| Glass with PV cell (?) at the surface | 25 × 25 $mm^2$; thickness 1.08 mm | Photovoltaic cell |
| Silicon chip | 3 × 3 $cm^2$; thickness 500 μm 1 × 1 $cm^2$; thickness 500 μm | Electronics |
| Microbattery on silicon | 1 × 1 $cm^2$; thickness 500 μm | Energy storage |
| Bimetallic material (e.g..: zinc/copper) | 3.5 × 2 $cm^2$; thickness 140 μm 5 × 1.6 $cm^2$; thickness 200 μm 7 × 1.6 $cm^2$; thickness 200 μm | Heat transfer, sensors |

Figure 8:
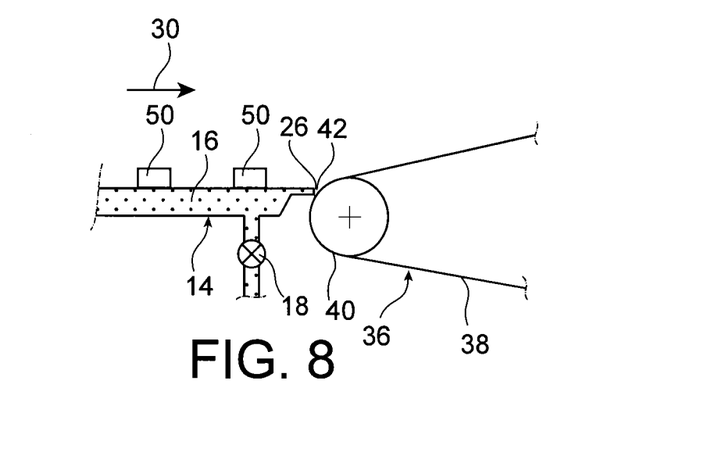
FIGS. 8 and 9 show different steps of another transfer method, also implemented by means of the system shown in FIGS. 1 and 2.
Figure 9:
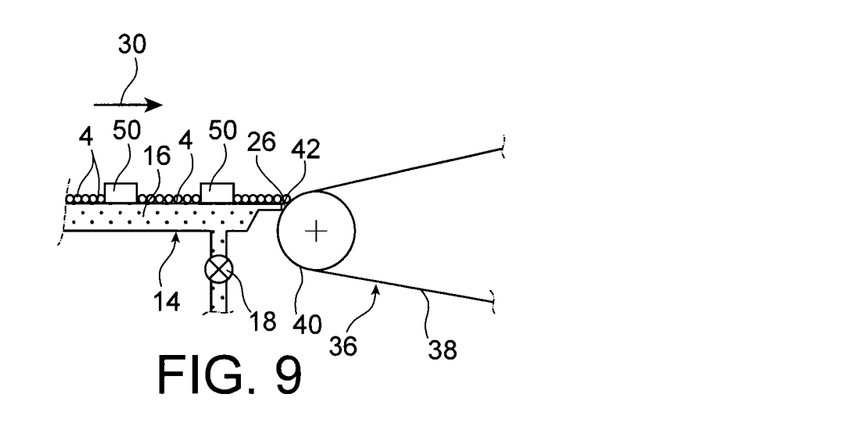

In reference now to FIGS. 8 and 9, the steps of a method for transferring objects according to another embodiment are schematically shown.

This method differs from the previous one in that the objects 50 are not placed on the ordered particle film 4, but float on the carrier liquid 16 while being surrounded by this same film. In this case, the objects 50 are then preferably placed on the carrier liquid before the compact particle film is formed, which then forms around these objects so as to hold them in position by surrounding them at their periphery. The objects thus have a lower surface directly in contact with the carrier liquid. In this embodiment, it is also the ordered particle film that enables the objects to be held in position and transported in an ordered manner to the substrate onto which they are to be deposited.

The other steps of the method are similar to those described for the previous method.

Figure 10:
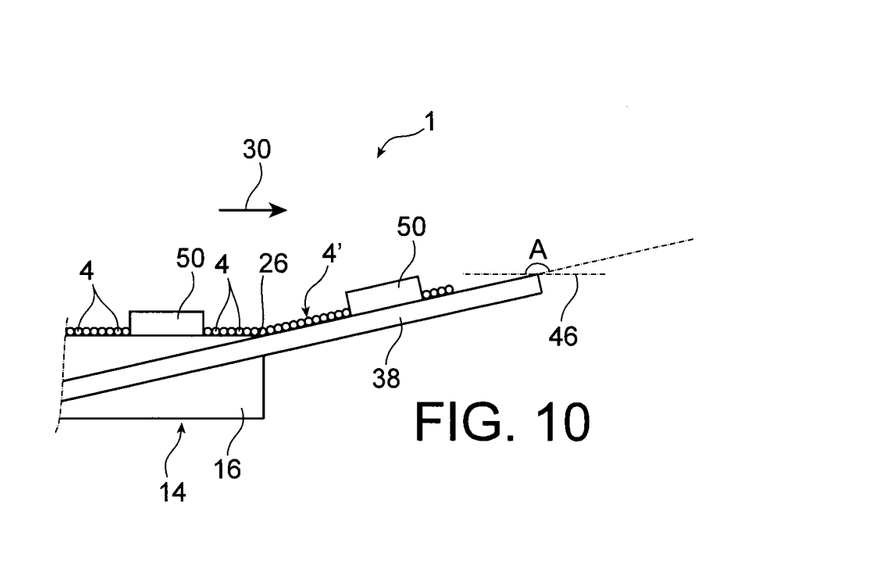
FIG. 10 shows a transfer system according to another preferred embodiment of the present invention.

Finally, FIG. 10 shows another system for transferring objects 1, which differs from the previous one essentially in that the moving substrate 38 is rigid. In this figure, the elements with the same references as those of the elements of the previous figures correspond to identical or similar elements.

As mentioned above, multiple solutions are possible for the deposition of the objects 50. Among the preferred solutions is a solution that consists in providing one or more conveyors for transporting these objects to the transfer area.

Figure 11A:
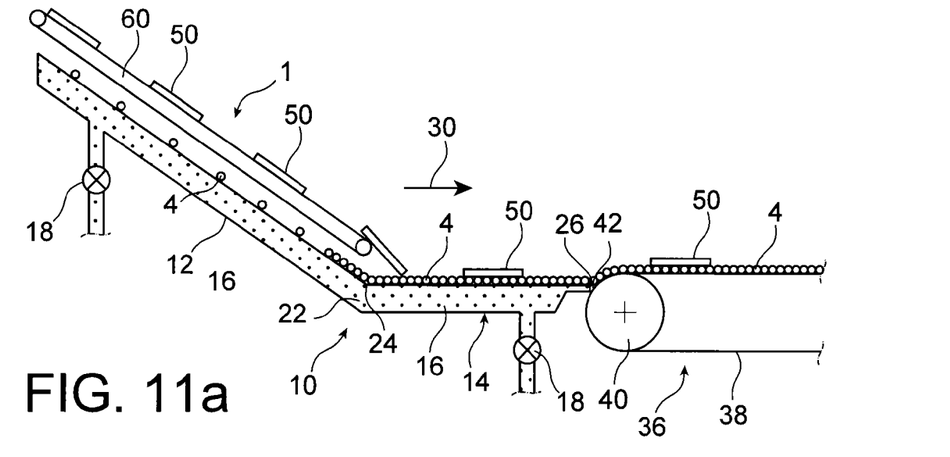
FIGS. 11*a* to 11*e* show different solutions for the placement of objects in the transfer area.

Each conveyor 60 is preferably parallel to the ramp 12, as shown in FIG. 11a. The conveyor 60, fixed or mobile, can be made in any manner considered to be suitable by a person skilled in the art, typically by means of a strip or a series of rollers. The objects are thus transported and deposited by the conveyor 60 at a predetermined rate according to the desired arrangement of these objects with respect to the particle film 4.

Figure 11B:
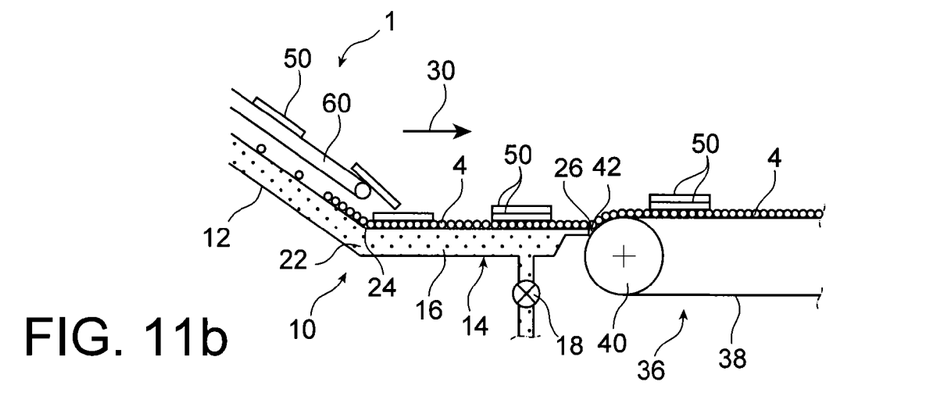
Figure 11C:
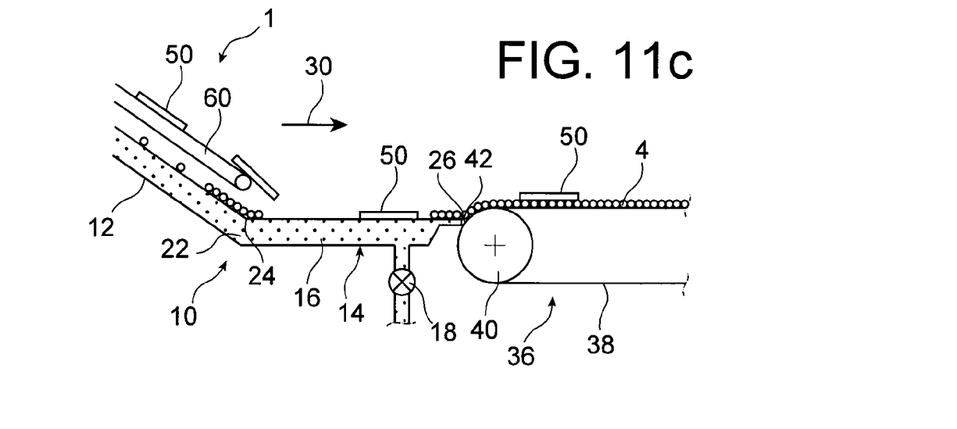
Figure 11D:
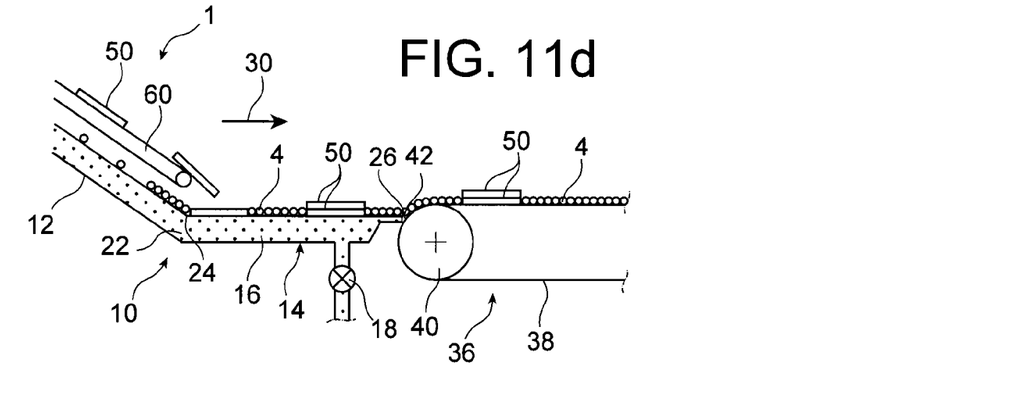

Moreover, with this technique, it is not only possible to deposit the objects 50 onto the particle film 4 as shown in FIG. 11a, but also directly onto the carrier liquid 16 before the particles 4 surround them in the transfer area 14, as schematically shown in FIG. 11c. Alternatively, it is also possible to deposit the objects onto other similar objects, as shown in FIGS. 11b and 11d. In FIG. 11b, the objects 50 are deposited onto other objects 50 themselves placed on the particle film, while, in the example of FIG. 11d, the objects 50 are deposited onto other objects 50 already integrated in the particle film 4.

Figure 11E:
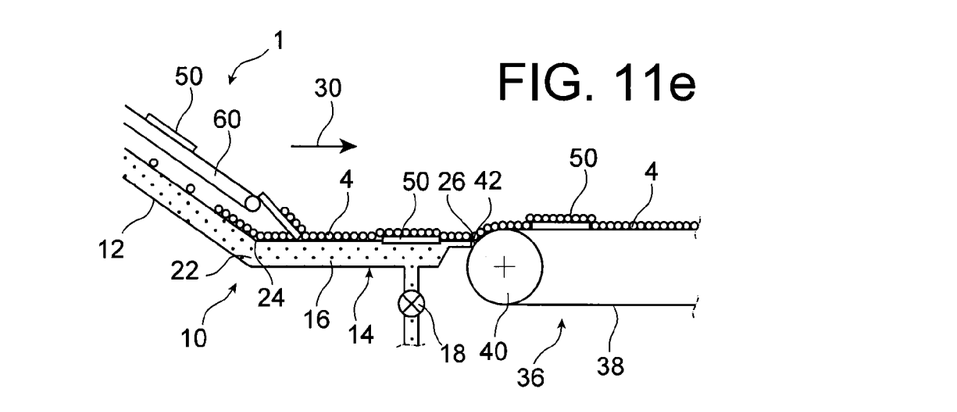

Finally, among these solutions for depositing objects in a so-called "unwinding" manner, it is possible for the objects 50 leaving the conveyor 60 to perforate the film so as to slide under it, as shown in FIG. 11e. After stabilization, each object 50 floating on the carrier liquid 16 is held by the particles 4 of the film that surrounds it.

Associated with the conveyor 60, a vision module (not shown) with image processing software can monitor the real-time movement of the objects on the conveyor 60, the transfer of these elements, and finally the pulling of the assembly onto the substrate. This vision module can also calculate the geometric deviations between the objects deposited onto the compact film, and optionally compare these deviations with a preprogrammed theoretical diagram, so as to validate the proper positioning of the objects deposited.

Of course, a person skilled in the art can make various modifications to the invention described above, solely in terms of non-limiting examples.

The invention claimed is:

1. A method for transferring objects onto a substrate, or a moving substrate,
    implemented by a transfer area comprising an inlet and an outlet spaced apart from one another by two lateral edges opposite one another, and holding a carrier liquid forming a conveyor,
    the objects being held by a compact film of particles floating on the carrier liquid of the transfer area,
    wherein the objects are moved with the particle film to be transferred onto the substrate when the objects reach the outlet.

2. A method according to claim 1, wherein at least one of the objects to be transferred is placed in the transfer area, floating on the carrier liquid forming a conveyor, to be surrounded by the particle film.

3. A method according to claim 1, wherein at least one of the objects to be transferred is placed in the transfer area on the compact particle film previously formed, to create, in the carrier liquid, a compression of particles supporting it.

4. A method according to claim 1, wherein a ratio between a large dimension of the particles and that of the objects to be transferred is between $10^4$ and $10^8$.

5. A method according to claim 1, wherein the particles are silica beads around 1 μm in diameter.

6. A method according to claim 1, wherein each object to be transferred has a large dimension greater than 0.2 cm.

7. A method according to claim 1, wherein each object includes at least one hydrophobic portion.

8. A method according to claim 1, wherein each object to be transferred is an element from the group of silicon chips, microbatteries, organic electronic components, metal elements, photovoltaic cells, cells, and microcells.

9. A method according to claim 1, wherein the film of ordered particles floating on the carrier liquid is obtained by compression, and/or dipole-dipole interaction, and/or by a magnetic field.

10. A method according to claim 1, implemented by an inclined ramp for particle circulation, attached to the inlet of the transfer area, and on which the carrier liquid is also intended to circulate.

11. A method according to claim 1, wherein, after the particles and objects have been transferred onto the substrate, comprising a thermal annealing for facilitating deposition and adhesion of the particles and objects on the substrate.

12. A method according to claim 1, wherein a deposition of objects in the transfer area is performed by one or more conveyors.

* * * * *